(12) United States Patent
Fischer

(10) Patent No.: US 8,283,224 B2
(45) Date of Patent: Oct. 9, 2012

(54) AMMONIA PRE-TREATMENT IN THE FABRICATION OF A MEMORY CELL

(75) Inventor: Bernard John Fischer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 104 days.

(21) Appl. No.: 12/342,264

(22) Filed: Dec. 23, 2008

(65) Prior Publication Data

US 2010/0155815 A1 Jun. 24, 2010

(51) Int. Cl.
*H01L 21/8238* (2006.01)

(52) U.S. Cl. ........ 438/211; 438/201; 438/257; 438/787; 257/E21.179; 257/E21.422

(58) Field of Classification Search .................. 438/201, 438/211, 257, 791; 257/314, 903
See application file for complete search history.

(56) References Cited

U.S. PATENT DOCUMENTS

| | | | |
|---|---|---|---|
| 6,163,050 A * | 12/2000 | Hisatomi et al. | 257/324 |
| 6,248,628 B1 * | 6/2001 | Halliyal et al. | 438/257 |
| 6,489,649 B2 * | 12/2002 | Kobayashi et al. | 257/314 |
| 6,512,264 B1 * | 1/2003 | Ogle et al. | 257/324 |
| 6,777,764 B2 * | 8/2004 | Hsieh et al. | 257/411 |
| 2001/0040252 A1 * | 11/2001 | Kobayashi et al. | 257/314 |
| 2002/0072175 A1 * | 6/2002 | Chang et al. | 438/264 |
| 2002/0084484 A1 * | 7/2002 | Kurihara et al. | 257/315 |
| 2003/0176038 A1 * | 9/2003 | Kobayashi et al. | 438/257 |
| 2004/0013009 A1 * | 1/2004 | Tsunoda et al. | 365/200 |
| 2004/0188778 A1 * | 9/2004 | Aoyama | 257/410 |
| 2005/0272198 A1 * | 12/2005 | Hamamura et al. | 438/230 |
| 2006/0094257 A1 * | 5/2006 | Hoffman et al. | 438/778 |

* cited by examiner

*Primary Examiner* — Michelle Mandala
(74) *Attorney, Agent, or Firm* — Alan A. R. Cooper; Warren L. Franz; Frederick J. Telecky, Jr.

(57) ABSTRACT

A method of manufacturing a memory cell 200. The method comprises forming a memory stack 215. Forming the memory stack includes pre-treating an insulating layer 210 in a substantially ammonia atmosphere for a period of more than 5 minutes to thereby form a pre-treated insulating layer 310. Forming the memory stack also includes depositing a silicon nitride layer on the pre-treated insulating layer.

23 Claims, 7 Drawing Sheets

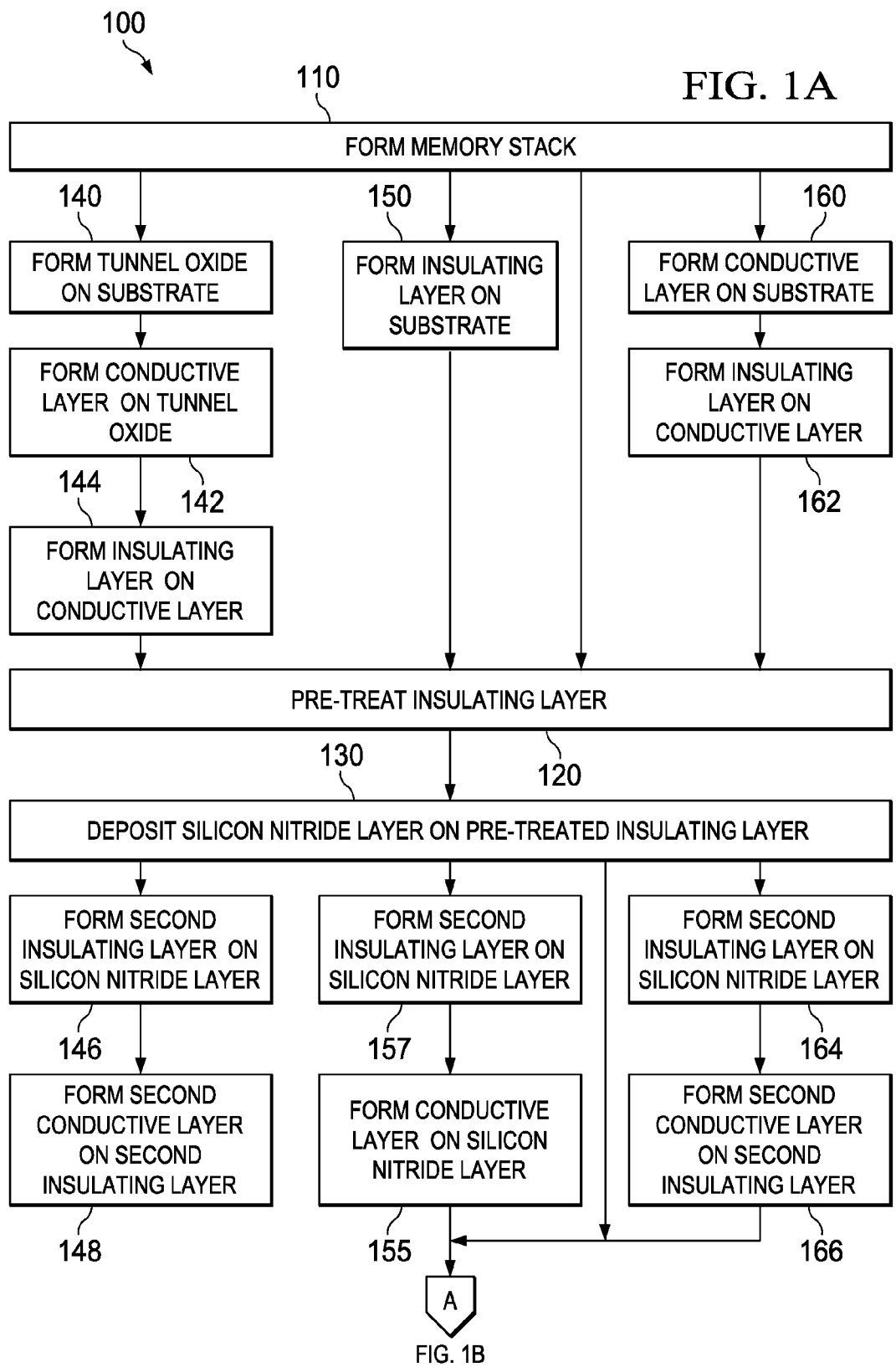

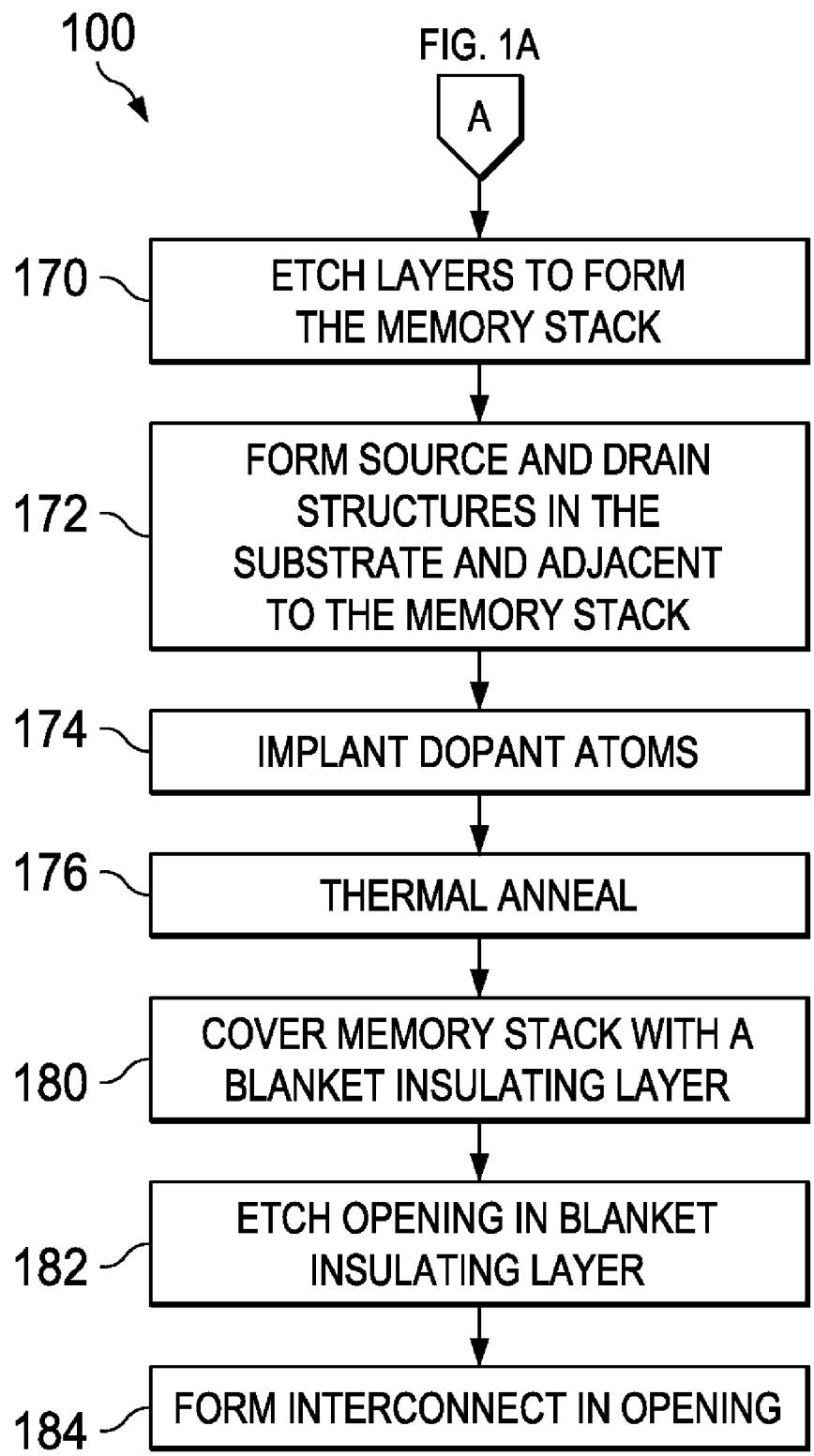

AMMONIA PRE-TREATMENT IN THE FABRICATION OF A MEMORY CELL

TECHNICAL FIELD

Figure 2:
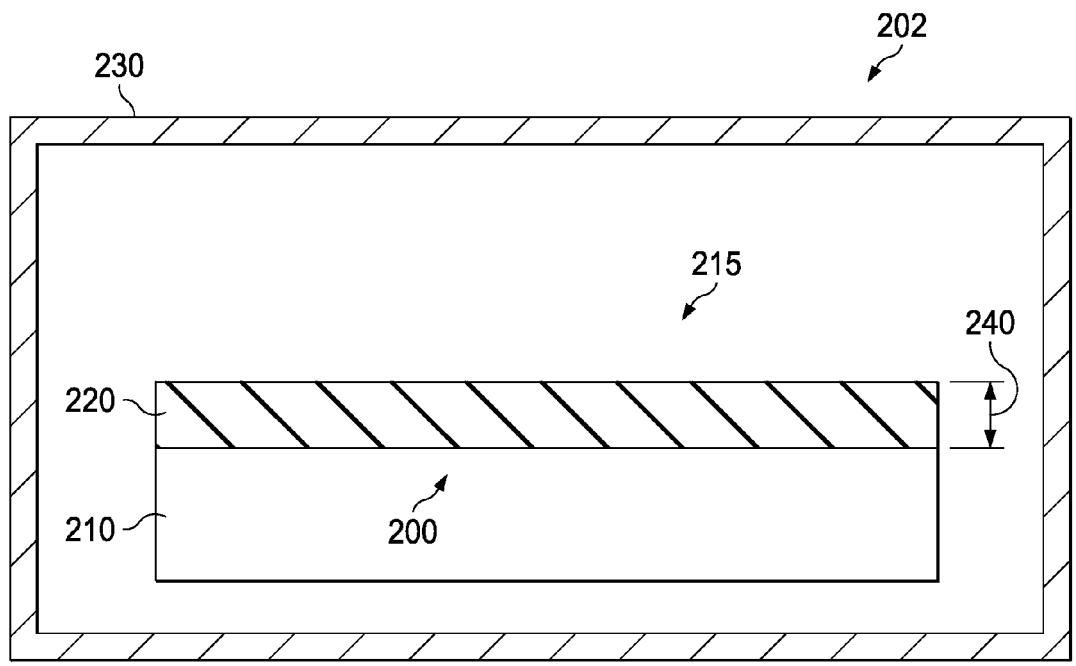

The invention is directed, in general, to electronic devices comprising memory cells, and more specifically, to the manufacture of such memory cells.

BACKGROUND

The construction of nonvolatile memory cells (e.g., floating gate, charge trapping, or capacitor memory cells) includes a dielectric layer that functions to store an electrical charge corresponding to information in the memory cell. The proper functioning of the memory cell often relies on the ability to erase information in the memory by dissipating the stored charge. To dissipate the stored charge, typically a standardized voltage, or a series of standardized voltage pulses, is applied across the dielectric layer, thereby causing the stored charge to be removed. Sometimes, larger numbers of cells in batches of fabricated memory cells cannot be erased by the standardized voltage and, therefore, these cells are designated as failed cells. The failed memory cells are either scrapped or subjected to a rework process, thereby reducing the yield, and increasing the costs of producing functional memory cells.

Accordingly, what is needed is a method of manufacturing memory cells by a process that minimizes the fabrication of cells with erase failures.

SUMMARY

One embodiment is a method of manufacturing a memory cell. The method comprises forming a memory stack. Forming the memory stack includes pre-treating an insulating layer in a substantially ammonia atmosphere for a period of more than 5 minutes to thereby form a pre-treated insulating layer. Forming the memory stack also includes depositing a silicon nitride layer on the pre-treated insulating layer.

Another embodiment is a method of manufacturing an electronic device. The method includes fabricating a memory cell on a semiconductor substrate, including forming a memory stack. Forming the memory stack includes forming a silicon oxide layer on the substrate, and pre-treating the silicon oxide layer, as described above, to form a pre-treated silicon oxide layer. Forming the memory stack further includes depositing a silicon nitride layer on the pre-treated silicon oxide layer.

Still another embodiment is an electronic device. The device comprises a memory cell having a memory stack. The memory stack includes a pre-treated insulating layer and a silicon nitride layer on the pre-treated insulating layer. The pre-treated insulating layer is formed by the above-described pre-treatment.

DRAWINGS

FIGS. 1A-1B presents a flow diagram of an example method of manufacturing a memory cell in accordance with the disclosure; and FIGS. 2-10 present cross-sectional views of example memory cells of the disclosure at different stages of fabrication in accordance with the disclosed method, e.g., the example method as presented in FIG. 1.

DESCRIPTION

As part of the present disclosure, it was discovered that an ammonia ($NH_3$) pre-treatment prior to deposition of a silicon nitride layer substantially reduced the number of erase failures in fabricated memory cells. This discovery was made while performing a rework process on a batch of failed memory cells. While re-depositing a dielectric layer which would include a silicon nitride layer on a silicon oxide layer, the silicon oxide layer was accidentally exposed to an $NH_3$ atmosphere for an extended period. A substantial reduction in erase failures was observed for the reworked memory cells that were subject to the extended $NH_3$ exposure.

While not limiting the scope of the disclosure by theoretical considerations, it is believed that the $NH_3$ pre-treatment helps to eliminate or prevent the formation of sites where unintentional charge traps can form at the interface between the silicon oxide and silicon nitride layer. The unintended charge traps are localized regions on the surface of a layer that can accumulate electrical charges (e.g., electrons or holes). The presence of such charge traps are thought to deter the ability of an applied voltage from dissipating the charge stored in the dielectric layer. For instance, charge traps may electrically shield the dielectric layer from a standardized erasing voltage, thereby increase the possibility of a failure to erase. Charge traps may include atomic-level surface voids or disturbances in the crystal structures (e.g., about 2 to 3 Angstroms in size) of the silicon oxide or silicon nitride layer at the interface between these layers. Charge traps may include surface contaminants, e.g., air-born organic compounds such as polydimethyl siloxane, on the silicon oxide layer. The contaminants can facilitate the accumulation of a charge on the surface.

Again, while not limiting the scope of the disclosure by theoretical considerations, it is believed that the $NH_3$ pre-treatment as disclosed herein can facilitate the formation of a void-free interface between the silicon oxide and silicon nitride layer. For instance, the $NH_3$ pre-treatment may convert a small portion (e.g., a thickness of about 5 Angstroms or less) of the silicon oxide layer into a nitride-rich silicon oxide layer. The nitride-rich silicon oxide layer advantageously provides a seed layer upon which a more uniform silicon nitride layer can be deposited onto.

It is also believed that the $NH_3$ pre-treatment as disclosed herein can facilitate the removal surface contaminants, or, cause the contaminants to be converted into a chemical form that is less readily able to accumulate a charge. For instance, $NH_3$ may chemically reduce oxygen-containing organic compound contaminants such they are unable, or have less ability, to facilitate the accumulation of surface charges.

One aspect of the disclosure is a method of manufacturing a memory cell. FIGS. 1A-1B presents a flow diagram of an example method 100 of manufacturing a memory cell in accordance with the disclosure.

As shown in FIG. 1A, the method 100 comprises a step 110 of forming a memory stack. Forming the memory stack (step 110) includes a step 120 of pre-treating an insulating layer in a substantially ammonia atmosphere for a period of more than 5 minutes to thereby form a pre-treated insulating layer. Forming the memory stack (step 110) also includes a step 130 of depositing a silicon nitride layer (e.g., $Si_xN_y$, where x equals about 3, and, y equals about 4) on the pre-treated insulating layer.

The term, substantially ammonia atmosphere, as used herein means that the bulk of an atmosphere that the insulating layer is exposed to comprises $NH_3$. That is, greater than 50 percent of the molecules in the atmosphere are $NH_3$ molecules. In some embodiments, e.g., the atmosphere includes about 60 percent or 77 percent $NH_3$. In some preferred embodiments, to minimize the time required to perform the pre-treatment, the atmosphere consists essentially of $NH_3$ (e.g., at least about 99 mole-percent $NH_3$).

In other cases the atmosphere further includes inert gases such as nitrogen gas ($N_2$). In still other cases, the atmosphere contains reactive nitrogen-containing gases that can facilitate the pre-treatment of the insulating layer. Nitric oxide and nitrous oxide are examples of nitrogen-containing gases that can facilitate the treatment of the insulating layer. For instance, nitric oxide and nitrous oxide can facilitate converting the uppermost portion of a silicon oxide insulating layer into a nitrogen-rich silicon oxide, or, to chemically reduce organic contaminants on the surface of the insulating layer.

In some embodiments, the insulating layer comprises silicon oxide, and in some cases, consists essentially of silicon oxide (e.g., at least about 99 mole percent $SiO_x$, where x equals about 2).

In some cases, the upper uppermost portion of the pre-treated insulating layer includes a nitrogen-rich layer. The nitrogen-rich layer can have a nitrogen content that is less than the nitrogen content of the silicon nitride layer deposited in step 130, but higher than the average nitrogen-content of the insulating layer. For instance, an insulating layer of silicon oxide can include an upper-most portion that comprises nitrogen-rich silicon oxide. In some cases, the nitrogen-rich silicon oxide portion may only be about 1 to 2 molecular layers thick (e.g., about 0.5 nanometers or less in thickness) and, hence, may not be always be readily discernable.

In some preferred embodiments, to further minimize the chance of having an erase failure for the memory cell, the period of the pre-treatment in step 120 is at least about 20 minutes, and even more preferably, about 40 to 70 minutes.

The $NH_3$ pre-treatment period of more than 5 minutes in step 120 is in contrast to some silicon nitride deposition processes (step 130) which, for safety reasons, introduce a flow of $NH_3$ into a deposition chamber before introducing a silicon-containing gas into the chamber. For instance, introducing a silicon-containing gas such as dichlorosilane only into the chamber can result in dichlorosilane decomposing into an explosive compound. To avoid this possibility, typically the $NH_3$ is introduced into the chamber for a few minutes to ensure that the silicon-containing gas has something to react with, and therefore not decompose into an explosive compound. However this is not a sufficient period to form a pre-treated layer such as described herein.

The $NH_3$ pre-treatment period of more than 5 minutes in step 120 is also in contrast to some silicon nitride deposition processes (step 130) where a temperature stabilization period immediately precedes the deposition. For instance, temperature stabilization can include a flow of $N_2$ gas into the deposition chamber for several minutes to ensure that the chamber's temperature is appropriately equilibrated to the appropriate value. However nitrogen gas is not sufficiently reactive to form the pre-treated layer.

In some preferred embodiments, to further minimize the chance of having an erase failure for the memory cell, the pre-treatment in step 120 is performed at a temperature of about 600° C. or higher. In some embodiments, to minimize the time between performing the pre-treatment step and the deposition, the temperature during the pre-treatment step 120 is substantially the same (e.g., within about 5° C.) as a deposition temperature in step 130. For example, a deposition temperature in a range of about 640 to 660° C. allows an about 5 nanometer thickness of silicon nitride to be reproducibly deposited (step 130) on a silicon oxide containing insulating layer within about 50 minutes. At higher temperatures, it may be difficult to control the thickness of the silicon nitride from one batch process to the next. In such cases, it is preferable for the pre-treatment step 120 to be preformed at a temperature in a range of about 640 to 660° C.

In other cases, the temperature during the pre-treatment step 120 can be greater than about 700° C. For instance, when a thicker silicon nitride layer is deposited (e.g., about 20 nanometers or thicker) a deposition temperature of about 700° C. is preferred to permit formation of the silicon nitride layer in about 60 minutes or less. In such cases, it is preferable for the pre-treatment step 120 to be performed at a temperature in a range of about 700° C.

As further illustrated in FIG. 1A, forming the memory stack in step 110 can include several additional steps depending upon the type of memory cell being fabricated.

In some cases, the memory cell is configured as an electrically programmable read-only memory (EPROM), or, electrically erasable programmable read-only memory (EEPROM) cell. In such embodiments, forming the memory stack (step 110) can include a step 140 of forming a tunnel oxide layer on a semiconductor substrate. Generally, a tunnel oxide is substantially thicker than a transistor gate oxide because the greater thickness facilitates retaining a charge in the insulating and silicon nitride layers. In some cases, for example, the tunnel oxide layer can be a silicon oxide that is about 10 nanometers thick. Forming the memory stack can also include a step 142 of forming a first conductive layer on the tunnel oxide layer. Forming the memory stack can further include a step 144 of forming the insulating layer on the first conductive layer. The silicon nitride layer deposited on the pre-treated insulating layer in step 130 is also formed on the first conductive layer. The first conductive layer can be configured as a floating gate of the memory stack. Forming the memory stack can further include a step 146 of forming a second insulating layer on the silicon nitride layer, and, a step 148 of forming a second conductive layer on the second insulating layer. The second conductive layer can be configured as a control gate of the memory stack. The conductive layer can be or include polysilicon, a metal silicide (e.g., cobalt silicide), metal layers, or, multilayered combinations thereof.

As another example, in some cases, the memory cell is a capacitor memory cell. In some configurations of the capacitor memory cell, a charge in the cell is induced in the substrate itself and there is no tunnel oxide and no floating gate, but there is a control gate. In such cases, the memory stack can be formed directly on the substrate. Forming the memory stack (step 110) can further include a step 150 of forming the insulating layer directly on a semiconductor substrate. In some embodiments when the substrate is a silicon substrate, the substrate can include a native oxide layer (e.g., 0.5 to 2 nm of silicon oxide) and the insulating layer formed in step 150 can be the native oxide layer itself, or, the insulating layer can be separately formed on the native oxide layer. Forming the memory stack (step 110) can also include a step 155 of forming a conductive layer on the silicon nitride layer. The conductive layer can be configured as the control gate.

In some cases, forming the memory stack (e.g., a capacitor memory cell) in step 110 further includes a step 157 of forming a second insulating layer on the silicon nitride layer. In such embodiments, the conductive layer can be formed on the silicon nitride layer (step 155) is also formed on the second insulating layer. In some cases the first and second insulating layers are silicon oxide layers, and hence the memory stack includes an oxide-nitride-oxide (ONO) stack, where the first silicon oxide layer of the ONO stack is the pre-treated insulating layer formed in step 130.

As still another example, in some cases the capacitor memory cell includes two conductive layers, corresponding to the electrodes of the capacitor. Forming the memory stack (step 110) can further include a step 160 of forming a first conductive layer on a semiconductor substrate. Similar to that discussed above, in some cases, the first conductive layer can be formed on a native oxide layer of the substrate. Forming the memory stack can further include a step 162 of forming the insulating layer (e.g., a first silicon oxide layer) on the first conductive layer. Forming the memory stack also can include a step 164 of forming a second insulating layer (e.g., a second silicon oxide layer) on the silicon nitride layer, and, a step 166 of forming a second conductive layer on the second insulating layer.

FIG. 1B illustrates additional steps that may be performed as part of manufacturing the memory stack, or, the memory cell generally. For instance, forming the memory stack can further include a step 170 of etching the layers to form the memory stack. For instance, the pre-treated insulating layer and silicon nitride layer can be etched by wet or dry etch processes to form the stack. Other optional layers, such as described above, may be etched as part of step 170. The manufacture of the memory cell can further include a step 172 of forming source and drain structures in the substrate and adjacent to the etched memory stack. Forming source and drain structures can include implanting dopant atoms into the substrate (step 174) and annealing the substrate (step 176) to diffuse the dopant atoms and thereby form the source and drain structures.

The manufacture of the memory cell can further include a step 180 of covering the memory stack, and in some embodiments the source and drain structures, with a blanket insulating layer, a step 182 of etching an opening in the blanket insulating layer, and, a step 184 of forming an interconnect in the opening, wherein the interconnect contacts the conductive layer (or second conductive layer) and thereby facilitate electrical coupling of the memory cell to other components of an electronic device that includes the memory cell.

Another aspect of the disclosure is a method of manufacturing an electronic device. FIGS. 2-10 present cross-sectional views of example memory cells 200 at different stages in the fabrication of an electronic device 202. Embodiments of the method of manufacture comprise fabricating a memory cell 200 on a semiconductor substrate 210 using the method 100 presented in FIGS. 1A-1B. For clarity, the steps in the method 100 are cross-referenced in the examples to follow.

Forming the memory cell 200 includes forming a memory stack 215 (step 110). FIG. 2 shows a partially-completed example memory stack 215 of the device 202 after forming a silicon oxide layer 220 on the substrate 210 (e.g., one of steps 144, 150 or 162, FIG. 1, depending on the particular memory cell 200 configuration being manufactured). In some cases, forming the silicon oxide layer 220 includes introducing silane plus nitrous oxide into a low pressure chemical vapor deposition chamber 230 at flow rates of about 20 sccm and about 570 sccm, respectively. In some cases, exposure to the atmosphere of silane and nitrous oxide for about 10 minutes produces a silicon oxide layer with a thickness 240 of about 5 nanometers. In alternative embodiments, the silicon oxide layer 220 can be formed by a high temperature anneal in the presence of oxygen ($O_2$) to form a thermally grown silicon oxide layer.

Figure 3:
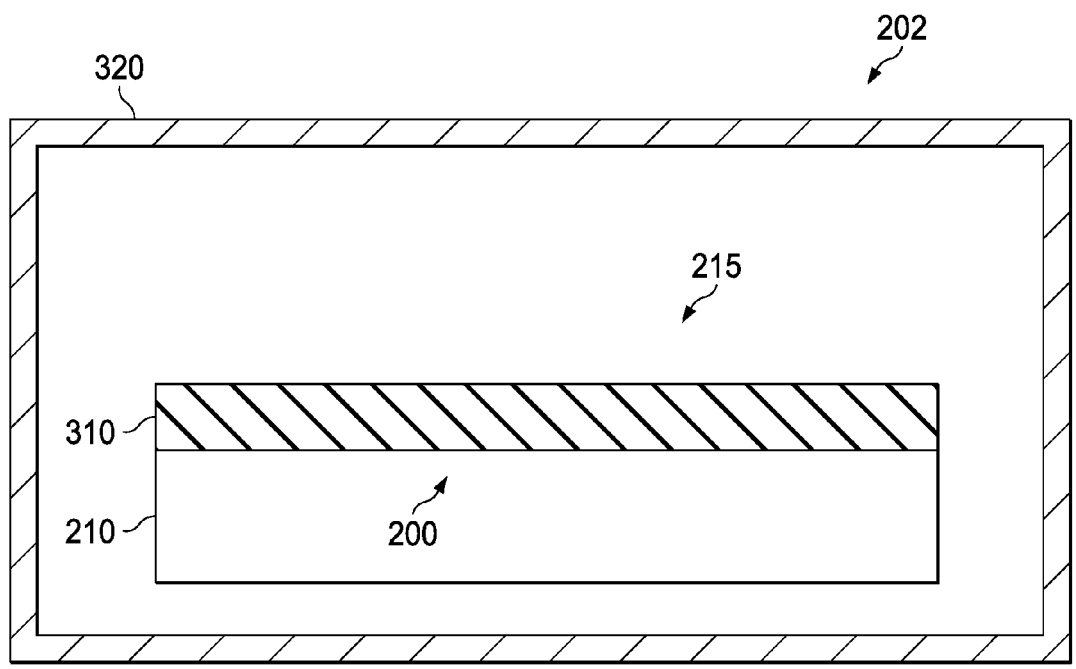

FIG. 3 shows the partially-completed example memory stack 215 of the device 202 of FIG. 2 after pre-treating the silicon oxide layer 220 (FIG. 2) in a substantially ammonia atmosphere for a period of more than 5 minutes to thereby form a pre-treated silicon oxide layer 310 (step 120). In some preferred embodiments, pre-treating of the silicon oxide layer 220 (FIG. 2) includes introducing $NH_3$ into a low pressure deposition chamber 320 at a flow rate of least about 100 sccm. In some preferred embodiments, the pre-treatment includes maintaining a chamber 310 pressure at less than 1 atmosphere and more preferably about $2 \times 10^{-4}$ atmospheres, and, a chamber temperature of about 650° C. for at least about 20 minutes, and more preferably, about 40 to 70 minutes. E.g., in some embodiments the period is about 45 minutes, and in other embodiments, about 55 minutes. To minimize the time to change the environmental conditions in the chamber for pre-treatment, in some cases the deposition chamber 310 for the pretreatment is different from the chamber 230 used for silicon oxide deposition.

Figure 4:
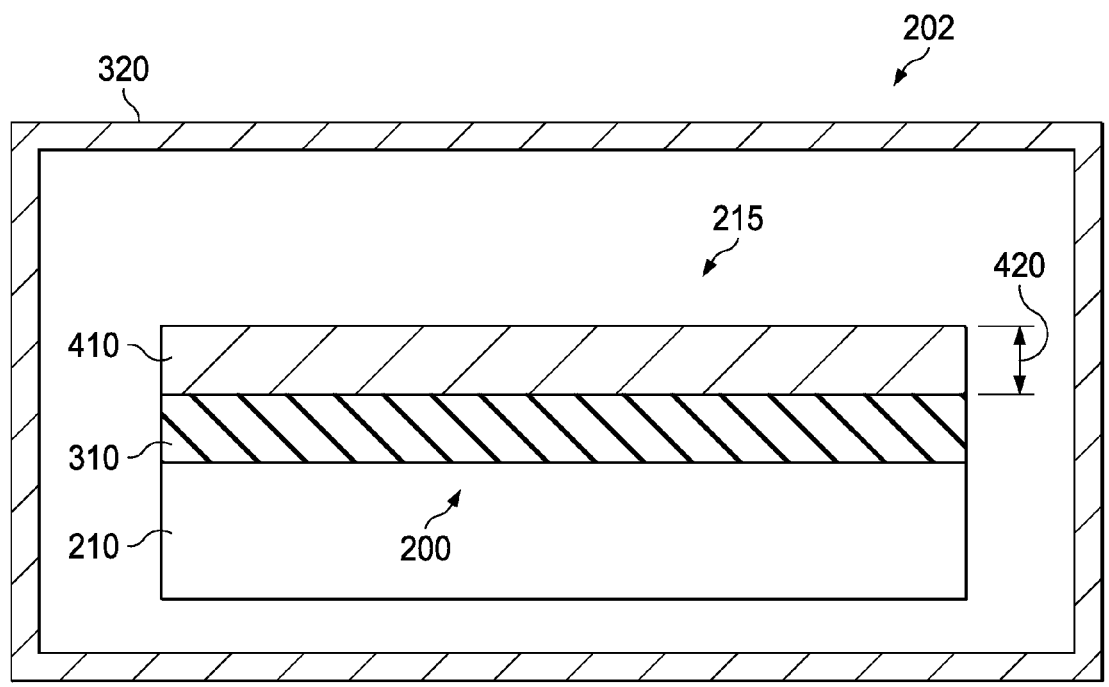

FIG. 4 shows the partially-completed example memory stack 215 of the device 202 of FIG. 3 after depositing a silicon nitride layer 410 on the pre-treated silicon oxide layer 310 (step 130). In some preferred embodiments, the chamber 320 used for the pretreatment (step 120) is also used for silicon nitride deposition (step 130). In some preferred embodiments, depositing the silicon nitride layer includes introducing $NH_3$ plus dichlorosilane ($H_2Cl_2Si$) into the deposition chamber 310 at flow rates of about 800 sccm and about 80 sccm, respectively. In some preferred embodiments, the chamber's 320 pressure is maintained at less than 1 atmosphere and more preferably about $2 \times 10^{-4}$ atmospheres, and, the temperature in chamber 320 is maintained at about 650° C. for about 50 to 60 minutes. In some cases, the deposited silicon nitride layer 410 has a thickness 420 of about 5 nanometers.

Figure 5:
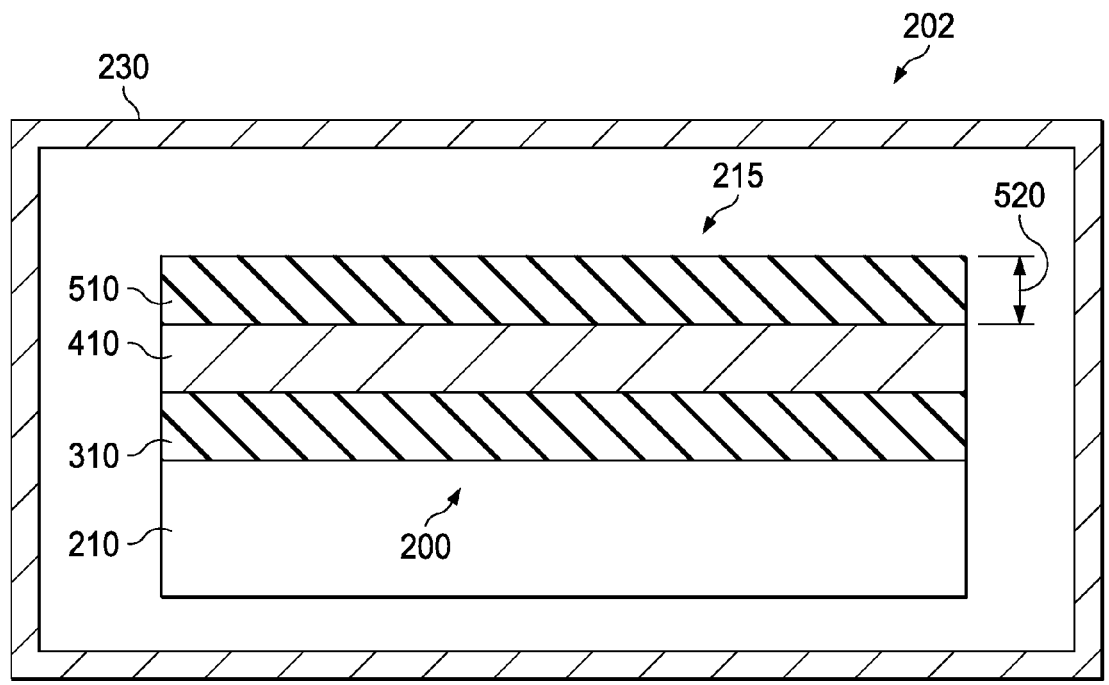

FIG. 5 shows the partially-completed example memory stack 215 of the device 202 of FIG. 4 after forming a second silicon oxide layer 510 on the silicon nitride layer 410 (e.g., one of steps 146, 157 or 164, FIG. 1, depending on the particular memory cell 200 being manufactured). In some preferred embodiments, the second silicon oxide layer 510 is formed using the same deposition process in the same chamber 230 as used to form the first silicon oxide layer 220 (FIG. 2). E.g., forming a second silicon oxide layer 510 can include introducing silane plus nitrous oxide into the low pressure chemical vapor deposition chamber 230 at flow rates of about 20 sccm and about 570 sccm, respectively. In some cases, the second silicon oxide layer 510 has the same thickness 520 (e.g., about 5 nanometers) as the first silicon oxide layer 220. Of course, different processes could be used to form the second silicon oxide layer 510, if desired.

Figure 6:
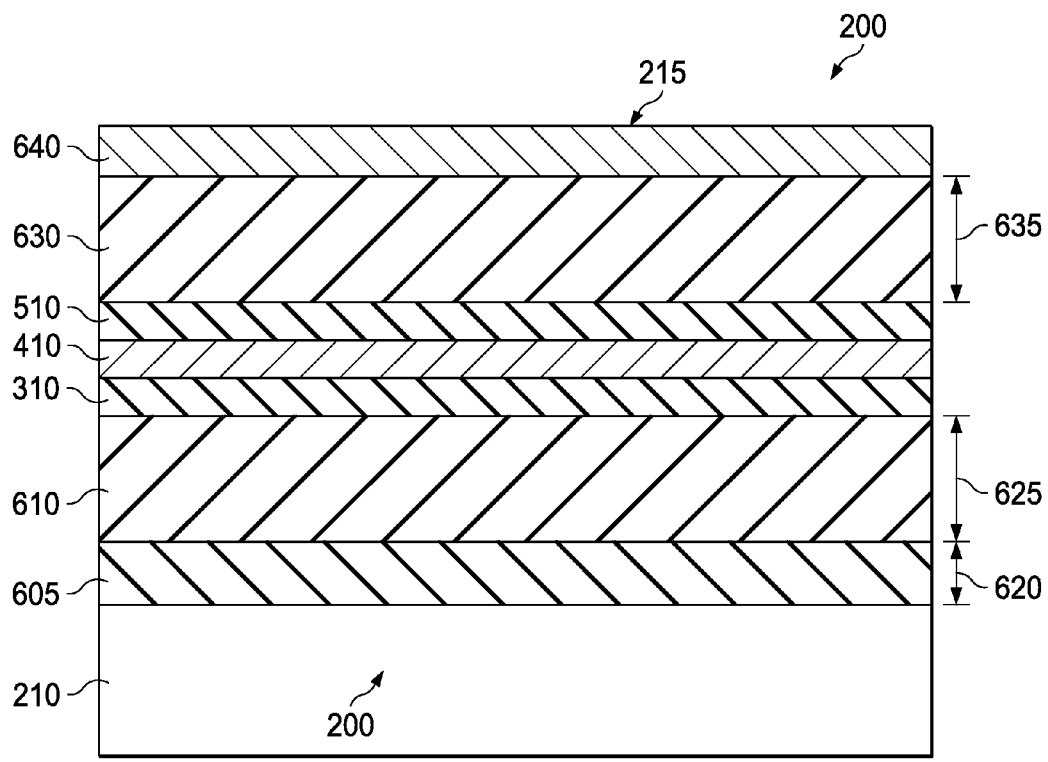
Figure 7:
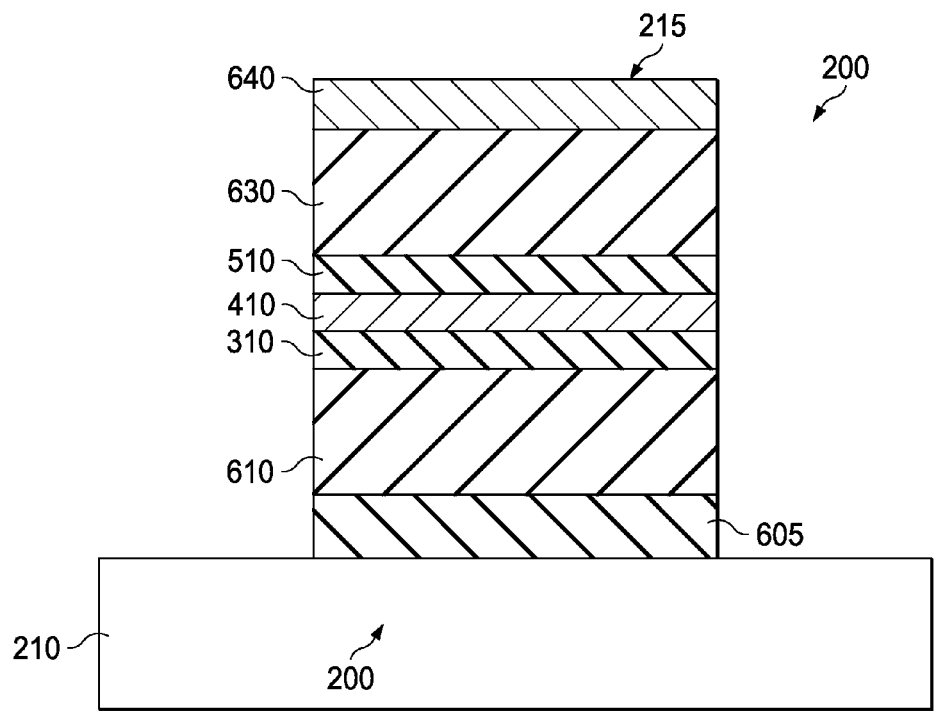
Figure 8:
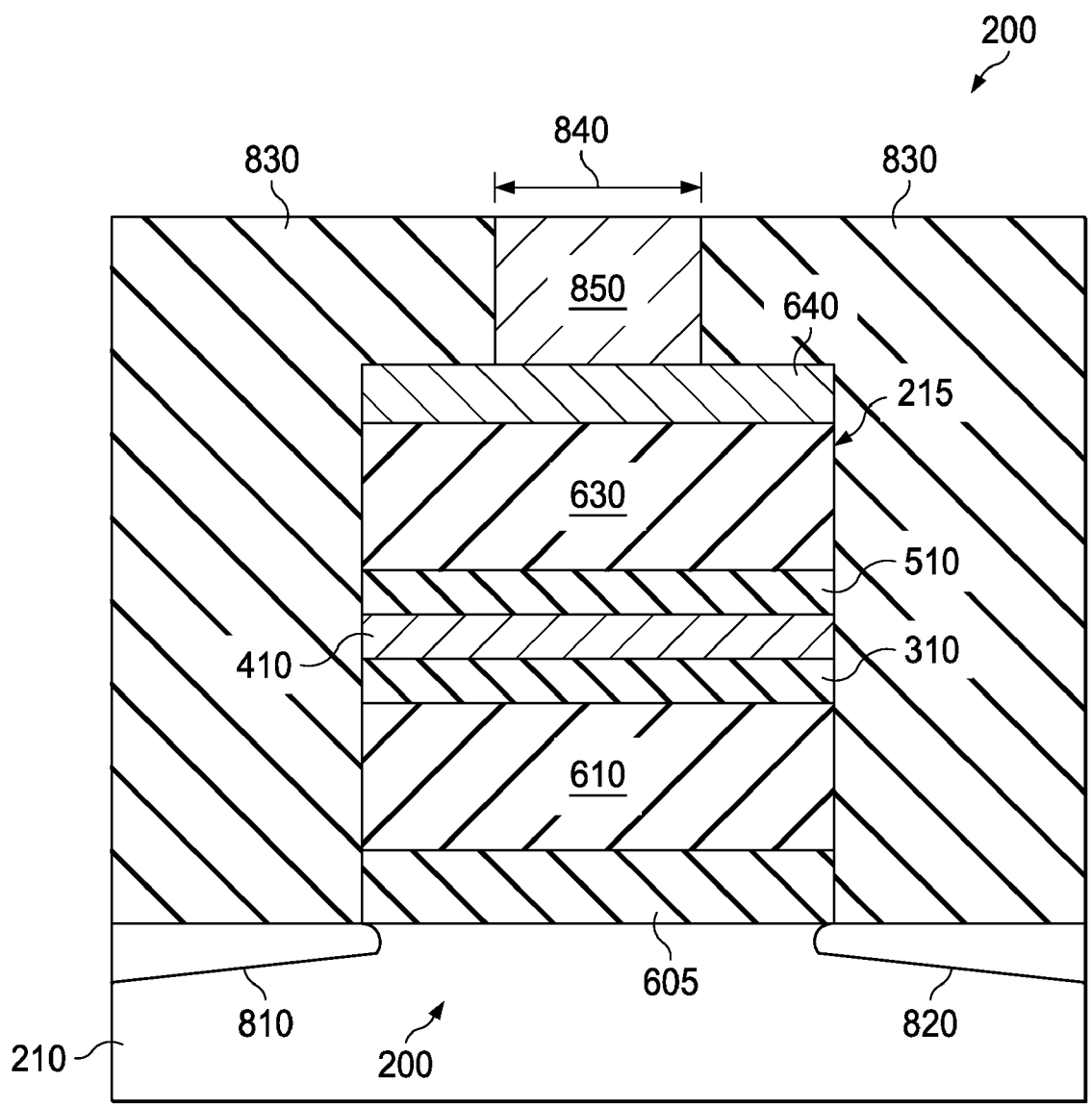

The manufacture of the electronic device 202 can include additional steps depending upon the particular configuration of the memory cell 200 being manufactured. For example, FIGS. 6-8 show additional steps in the fabrication of a memory cell 200 configured as an EEPROM or EPROM memory cell. A lower scale of magnification is used compared to FIGS. 2-5 so that additional features of the cell 200 can be more clearly depicted.

FIG. 6 shows the memory stack 215 of FIG. 5 in a configuration where the first silicon oxide layer 220 (FIG. 2), silicon nitride layer 410 and second silicon oxide layer 510 are formed on a tunnel oxide layer 605 and a first polysilicon layer 610. The tunnel oxide layer 605 (step 140) and the first polysilicon layer 610 (step 142) are formed on the substrate 210 prior to forming the first silicon oxide layer 220. One skilled in the art would be familiar with the procedures to form a tunnel oxide layer and polysilicon layer. For instance, forming the tunnel oxide layer 605 can include a low pressure chemical deposition in the presence of silane plus nitrous oxide, or, a thermal anneal in an $O_2$ atmosphere. For instance, forming the first polysilicon layer 610 can include a low pressure chemical deposition in the presence of a silane atmosphere. In some embodiments, such as when the memory cell 200 is configured as an EEPROM or EPROM memory cell, the tunnel oxide layer 605 has a thickness 620 of about 10 nanometers and the first polysilicon layer 610 has a thickness of 625 of about 120 nanometers.

FIG. 6 also shows the memory stack 215 after forming a second polysilicon layer 630 on the second silicon oxide layer 510 (step 148). The second polysilicon layer 630 can be formed by the same procedure as used to form the first polysilicon layer 610, although a different process could be used, if desired. In some embodiments, such as when the memory cell 200 is configured as an EEPROM or EPROM memory cell, the second polysilicon layer 630 has a thickness of 635 of about 250 nanometers. In some cases a metal silicide layer 640, such as a cobalt silicide layer, can also be formed on the second polysilicon layer 630 as part of forming a conductive layer (step 148). E.g., forming the metal silicide layer 640 can include physical deposition of cobalt and silicon by a sputtering process.

FIG. 7 shows the memory stack 215 of FIG. 6 after etching the layers (e.g., the polysilicon 610, 630, silicon oxide 220, 510, silicon nitride 410 or metal silicide 640 layers) to form the stack 215 (step 170). One skilled in the art would be familiar with conventional photolithography and etching procedures to etch these layers in a single-step or multi-step etching process.

FIG. 8 shows the memory cell 200 of FIG. 7 after forming source and drain structures 810, 820 in the substrate 210 and adjacent to the memory stack 215 (step 172). One skilled in the art would be familiar with processes to form source and drain structures 810, 820. For example, in some embodiments a conventional ion implantation device is used to implant dopant atoms (e.g., boron, phosphorus or arsenic) into the substrate 210, followed by a high temperature anneal (e.g., about 900° C. or higher) to diffuse the dopants in the substrate 210 and thereby form the source and drain structures 810, 820 (steps 174, 176).

FIG. 8 also shows the memory cell 200 after covering the memory stack 215 with a blanket insulating layer 830 (step 180), after etching an opening 840 in the blanket insulating layer 830 (step 182) and after forming an interconnect 850 in the opening 840 (step 184), such that the interconnect 850 contacts the stack 215 (e.g., the metal silicide layer 640). For example, a conventional chemical deposition processes can be used to form a tungsten interconnect 850 in the opening 840.

Figure 9:
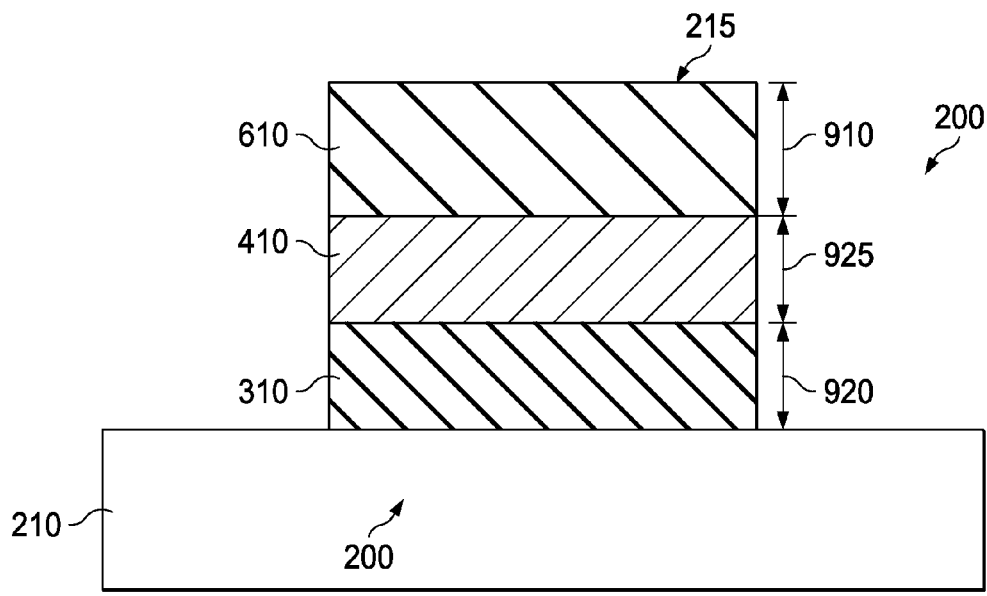
Figure 10:
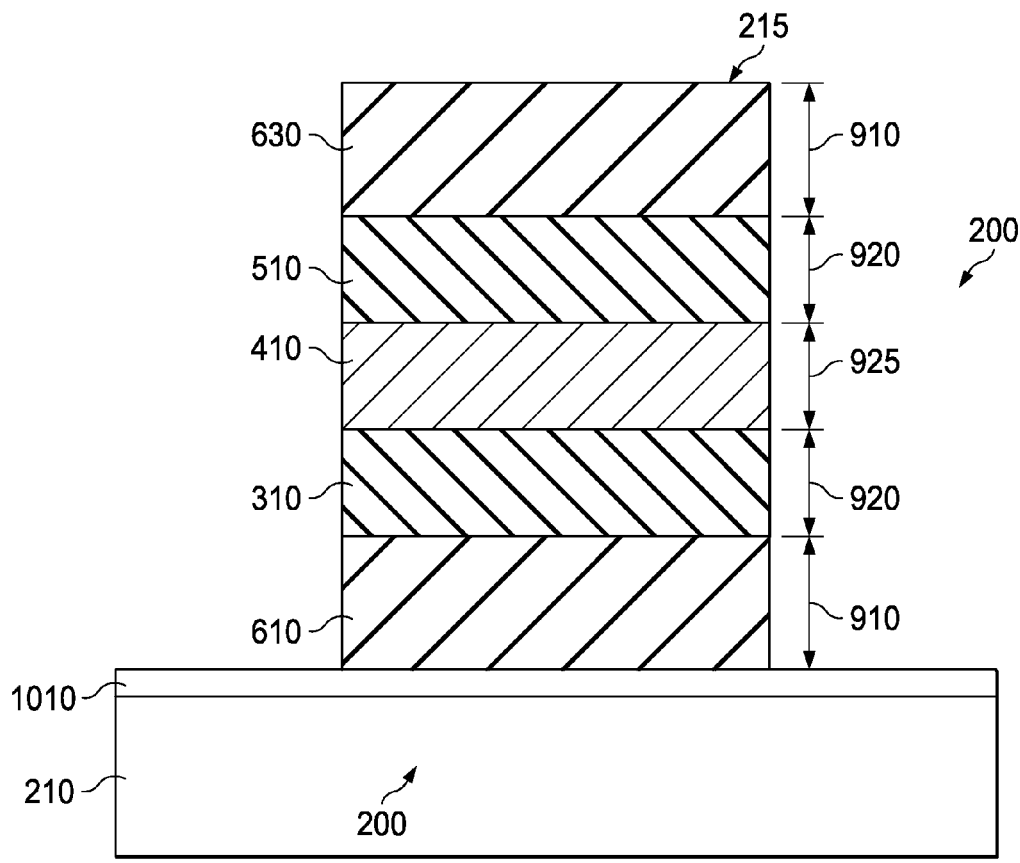

Procedures similar to those presented in FIGS. 2-8 could be used to form alternative configurations of memory cells in accordance with the method 100 presented in FIG. 1. For example, FIGS. 9-10 show alternative embodiments of the memory cell 200 configured as different types of capacitor memory cells. The reference numbers are used to depict structures similar to those shown in FIGS. 2-8, and, again, the steps in the method 100 are cross-referenced.

FIG. 9 shows an embodiment of the memory stack 215 of, e.g., FIG. 5, wherein the silicon oxide layer is formed directly on the substrate 210 (step 150) and then pre-treated (step 120) to form the pre-treated silicon oxide layer 310. The silicon nitride layer 410 can be formed on the pre-treated silicon oxide layer 310 (step 130) as discussed elsewhere herein. As further illustrated in FIG. 9, a first polysilicon layer 610 is then formed on the silicon nitride layer 410 (step 155). In some preferred embodiments, the polysilicon layer 610 has a thickness 910 of about 320 nanometers and the pre-treated silicon oxide layer 310 and silicon nitride layer 410 each have thicknesses 920, 925 in a range of about 20 to 50 nanometers. FIG. 9 also shows the memory stack 215 after etching the layers 220, 310, 610 to form the stack 215 (step 170).

FIG. 10 shows another embodiment of the memory stack 215 of, e.g., FIG. 5, wherein a first silicon oxide layer is formed (step 162) on a previously formed first polysilicon layer 610 (step 160) and then the silicon oxide layer is pre-treated to form the pre-treated silicon oxide layer 310 (step 120). As shown in FIG. 10, in some cases, the first polysilicon layer 610 is formed on a native oxide layer 1010 of the substrate 210. A silicon nitride layer 410 is then formed on the pre-treated silicon oxide layer 310 (step 130). A second silicon oxide layer 510 is formed on the silicon nitride layer 410 (step 164), and a second polysilicon layer 630 is formed on the second silicon oxide layer 510 (step 166).

In some embodiments, the first and second polysilicon layers 610, 630, first and second silicon oxide layers 310, 510 and silicon nitride layer 310 have the same thicknesses 910, 920, 925 as described in the context of FIG. 9. The same process as described in the context of FIGS. 1 and 7 can be performed to etch the layers 610, 220, 310, 630 to form the stack 215.

One skilled in the art would be familiar with additional processing steps to complete the fabrication of the memory cell 200 shown in FIGS. 9-10. Such step may include, for example, forming a blanket insulation layer, forming an opening in the blanket insulation layer and forming an interconnect in the opening, similar to that presented in the context of FIGS. 1B and 8.

Another aspect of the disclosure is the electronic device 202 itself. As shown in FIGS. 8-10, the device 202 comprises a memory cell 200, which in turn has a memory stack 215. The memory stack 215 includes a pre-treated insulating layer 310 and a silicon nitride layer 410 on the pre-treated insulating layer 310. The pre-treated insulating layer 310 is formed by a pre-treatment in a substantially ammonia atmosphere for a period of more than 5 minutes (step 130).

The cell 200 can include any of the embodiments of the memory stack 215 discussed in the context of FIGS. 1-10.

For instance, in some embodiments, the memory stack 215 further includes a second insulating layer 510 (e.g., a silicon oxide layer) on the silicon nitride layer 410 (FIGS. 5-10). For instance, in some embodiments, the memory stack 215 further includes a floating gate and a control gate (e.g., first conductive layers 610, 630 FIG. 8). The pre-treated insulating layer 310 and the silicon nitride layer 410 can be located between the floating gate 610 and control gate 630.

In some preferred embodiments, a coupling coefficient between the floating gate 610 and the control gate 630 is substantially greater than the coupling coefficient between these gates 610, 630 with a non-treated insulating layer (e.g., insulating layer 210, FIG. 2) therebetween. The term "coupling coefficient" as used herein refers to a measure of the efficiency of charge transfer to or from the memory cell 200. The coupling coefficient is defined as the ratio of the capacitance between control gate 630 and floating gate 610, divided by the total capacitance between the floating gate 630 and all the other conductive structures of the cell 200 (e.g., the substrate 210, the control gate 630, and source and drain structures 810, 820).

A high coupling constant is desirable because this signifies that the capacitance between control gate 630 and floating gate 610 is the dominant capacitance in the cell 200. For example, in some preferred embodiments, the coupling coefficient between the gates 610, 630 is at least about 40 percent and more preferably about 50 to 60 percent. In comparison the coupling coefficient between the gates 610, 630 with a non-treated insulating layer there-between is about 10 percent.

For the memory cells 200 of the disclosure having the high coupling constant, a relatively small voltage, or low number of a series of voltage pulses, applied to the control gate 630 is needed to reliably erase the cell 200. For example, in some embodiments at least about 90 percent of a batch of the memory cells 200 if the disclosure can be erased by a standardized voltage. This is at least about 5 percent greater than for batches of similarly configured cells, except with the insulating layer not receiving the pre-treatment, have an erase failure in response to the same standardized voltage.

Those skilled in the art to which the invention relates will appreciate that other and further additions, deletions, substitutions and modifications may be made to the described example embodiments, without departing from the invention.

What is claimed is:

1. A method of manufacturing an integrated circuit including a memory cell having an oxide-nitride-oxide (ONO) memory stack, the method comprising:
    forming a first silicon oxide layer on a substrate using silane and nitrous oxide through a low-pressure chemical vapor deposition (LPCVD);
    treating the first silicon oxide layer with ammonia in the absence of dichlorosilane for a period of more than 5 minutes at a temperature of about 640 to 660° C.,
    after treating the first silicon oxide layer, forming a silicon nitride layer on the treated first silicon oxide layer using dichlorosilane and ammonia; and
    forming a second silicon oxide layer on the silicon nitride layer.

2. The method of claim 1, wherein the period is at least about 20 minutes.

3. The method of claim 1, wherein the period is in a range of about 40 to 70 minutes.

4. The method of claim 1, wherein pre-treating said the first silicon oxide layer comprises flowing ammonia into a low pressure deposition chamber at a flow rate of at least about 100 sccm.

5. The method of claim 4, wherein forming the silicon nitride layer includes flowing ammonia and dichlorosilane into the chamber at flow rates of about 800 sccm and about 80 sccm, respectively.

6. The method of claim 1, wherein forming at least one of the first or second silicon oxide layers includes flowing silane and nitrous oxide into a low pressure chemical vapor deposition chamber at flow rates of about 20 sccm and about 570 sccm, respectively.

7. The method of claim 1, further comprising forming an insulating layer on the substrate; and forming a first conductive layer on the insulating layer; wherein the first silicon oxide layer is formed over the first conductive layer.

8. The method of claim 7, further comprising forming a second conductive layer over the second silicon oxide layer.

9. The method of claim 8, wherein the substrate is a semiconductor substrate; and forming the insulating layer comprises performing a thermal anneal in an oxygen environment.

10. The method of claim 9, wherein the first and second conductive layers comprise polysilicon.

11. The method of claim 1, wherein the pre-treating comprises pre-treating in an atmosphere consisting of greater than 99 mole-percent ammonia.

12. A method of manufacturing an integrated circuit including a memory cell having an oxide-nitride-oxide (ONO) memory stack, the method comprising:
    forming a first silicon oxide layer on a substrate using silane and nitrous oxide through a low-pressure chemical vapor deposition (LPCVD);
    treating the first silicon oxide layer with ammonia in the absence of dichlorosilane for a period of more than 5 minutes at a temperature of about 640 to 660° C.,
    after treating the first silicon layer, forming a silicon nitride layer on the treated first silicon oxide layer using dichlorosilane and ammonia; and
    forming a second silicon oxide layer on the silicon nitride layer using silane and nitrous oxide.

13. The method of claim 12, wherein the first silicon oxide layer and the second silicon oxide layer are formed in a low pressure chemical vapor deposition chamber.

14. The method of claim 13, wherein forming the first silicon layer, pre-treating the first silicon oxide layer, forming the silicon nitride layer, and forming the second silicon oxide layer are all done in the same deposition chamber.

15. The method of claim 12, further comprising forming a tunnel oxide layer on the substrate; and forming a first conductive layer on the tunnel oxide layer; wherein the first silicon oxide layer is formed over the first conductive layer.

16. The method of claim 15, further comprising forming a second conductive layer over the second silicon oxide layer.

17. The method of claim 16, wherein the tunnel oxide layer comprises silicon oxide, and the first and second conductive layers comprise polysilicon.

18. The method of claim 17, wherein forming the first silicon oxide layer, pre-treating the first silicon oxide layer, forming the silicon nitride layer, and forming the second silicon oxide layer are all done in the same deposition chamber.

19. The method of claim 17, wherein the polysilicon is deposited using silane.

20. The method of claim 18, wherein the tunnel oxide is formed using a thermal anneal in an oxygen atmosphere.

21. The method of claim 17, wherein the pre-treating comprises pre-treating in an atmosphere consisting of greater than 99 mole-percent ammonia.

22. The method of claim 1, wherein the ONO memory stack includes a capacitor.

23. The method of claim 12, wherein the ONO memory stack includes a capacitor.

* * * * *